United States Patent [19]
Golan

[11] Patent Number: 5,826,180
[45] Date of Patent: Oct. 20, 1998

[54] NEAR HOMODYNE RADIO FREQUENCY RECEIVER

[75] Inventor: Mordechay Golan, Rishon LeZion, Israel

[73] Assignee: Nice Systems Ltd., Tel-Aviv, Israel

[21] Appl. No.: 291,251

[22] Filed: Aug. 16, 1994

[30] Foreign Application Priority Data

Aug. 8, 1994 [IL] Israel ......................................... 110592

[51] Int. Cl.[6] .................................................. H04B 1/12
[52] U.S. Cl. ........................ 455/302; 455/324; 455/226.1
[58] Field of Search ..................................... 455/302, 303, 455/324, 226.1, 226.2, 226.3, 227, 67; 375/213, 261, 340

[56] References Cited

U.S. PATENT DOCUMENTS

| 4,584,715 | 4/1986 | Baars et al. ............................ 455/302 |
|---|---|---|
| 4,852,123 | 7/1989 | Bickley et al. ...................... 455/324 X |
| 5,315,620 | 5/1994 | Halawani et al. ....................... 375/340 |
| 5,392,330 | 2/1995 | Paniccia, Jr. .......................... 455/303 X |

Primary Examiner—Reinhard J. Eisenzopf
Assistant Examiner—Philip J. Sobutka
Attorney, Agent, or Firm—Skjerven, Morrill, MacPherson, Franklin & Friel

[57] ABSTRACT

A radio frequency receiver and method for operating one is disclosed. The receiver includes a tuning unit, an inphase-quadrature (I/Q) mixer, and a calibrated image rejection processor. The tuning unit selectably tunes to a tuning frequency close but not equal to an input modulated radio frequency and creates thereby a periodic signal having the tuning frequency. The I/Q mixer convolves the modulated radio frequency signal with inphase and quadrature versions of the periodic signal and low pass filters the resultant signals. The calibrated image rejection processor corrects at least one of the filtered resultant signals and performs image rejection on the corrected signals.

2 Claims, 3 Drawing Sheets

NEAR HOMODYNE RADIO FREQUENCY RECEIVER

FIELD OF THE INVENTION

The present invention relates to radio frequency tuners generally.

BACKGROUND OF THE INVENTION

Radio frequency tuners are known in the art. They operate, as shown in FIG. 1 to which reference is now made, by convolving, via a tuner 10, the modulated radio frequency (RF) signal (containing the signal to be transmitted modulated onto the carrier radio frequency $f_{RF}$) with a signal having a known, non-modulated tuning frequency, $f_{1o}$. The convolution removes the radio frequency and produces a modulated difference signal which contains the transmitted information.

Early radio tuners were called "homodyne receivers" wherein the tuning frequency, $f_{1o}$, was at the carrier radio frequency $f_{RF}$. The output difference signal was then a DC signal. Unfortunately, DC and other very low frequency signals are typically very noisy and are not easily processed by demodulators.

To solve the noise and demodulation problems, "heterodyne" receivers were designed which set the tuning frequency $f_{1o}$ to a frequency at some frequency distance (e.g. 10.7 MHz) from the carrier frequency $f_{RF}$. The resultant difference signal is then at an intermediate frequency $f_{IF}$ equal to the frequency distance of the tuning frequency $f_{1o}$ from the carrier frequency $F_{RF}$. The intermediate frequency $f_{IF}$ is large enough to avoid any low frequency noise problems.

However, as shown in FIG. 2 to which reference is now briefly made, taking the difference of two signals at different frequencies can produce unwanted signals. The intermediate frequency $f_{IF}$ is produced by taking the difference of the tuning frequency $f_{1o}$ and the carrier frequency $f_{RF}$. It can also be produced from the tuning frequency $f_{1o}$ by talking the difference of the tuning frequency $f_{1o}$ and a frequency $f_2$ which is $f_{IF}$ less than $f_{1o}$. The influence of the signal at $f_2$, in the intermediate frequency signal, is called the "ghost" or "image" signal.

In order to get rid of the image signal, the input of the tuner 10 has to be filtered through a band pass filter 12 which passes only those frequencies in the general vicinity of the carrier frequency $f_{RF}$ and none in the vicinity of the frequency $f_2$.

Unfortunately, the digital representation of the intermediate frequency difference signal requires many sample points. This is due to the fact that the number of sample points required to fully describe a periodic signal is a linear function of the frequency. Since the intermediate frequency is at a fairly high frequency, the number of required sample points is correspondingly high.

SUMMARY OF THE PRESENT INVENTION

It is an object of the present invention to provide a radio frequency receiver and a method for operating such a receiver which can digitally process the difference signal.

In accordance with a preferred apparatus embodiment of the present invention, the receiver includes a tuning unit, an inphase-quadrature (I/Q) mixer and a calibrated image rejection processor. The tuning unit produces a periodic signal at the tuning frequency which is tunably set to a tuning frequency close to the carrier frequency. The inphase-quadrature mixer convolves the carrier frequency signal with inphase and quadrature versions of the periodic signal and low pass filters the resultant signals. The image rejection processor corrects at least one of the filtered resultant signals and performs image rejection on the corrected signals.

Additionally, in accordance with a preferred embodiment of the present invention, the receiver also includes a signal generator for generating a predetermined signal during a calibration procedure and for providing it to the I/Q mixer instead of the modulated radio frequency signal.

Moreover, in accordance with a preferred embodiment of the present invention, the calibrated image rejection processor includes a calibration determiner, an I/Q corrector and an image rejector. The calibration determiner receives the output of the I/Q mixer during the calibration procedure and determines calibration parameters from the output. The I/Q corrector utilizes the calibration parameters to correct at least one of the filtered resultant signals during regular operation, producing thereby the corrected signals. The image rejector performs image rejection on the corrected signals.

Further, in accordance with a preferred embodiment of the present invention, the tuning unit is a multi-octave tuning unit and includes a tunable oscillator for creating a periodic signal having a single octave frequency range and a frequency divider for dividing the frequency of the periodic signal by a multiple of two.

The method of the present invention preferably includes the following steps:

a) creating a periodic signal having a tuning frequency close but not equal to the radio frequency;

b) convolving the modulated radio frequency signal with inphase and quadrature versions of the periodic signal;

c) low pass filtering the resultant signals;

d) correcting at least one of the filtered resultant signals; and e) performing image rejection on the corrected signals.

Additionally, in accordance with a preferred embodiment of the present invention, the step of convolving, during a calibration procedure, involves convolving a predetermined calibration signal rather than the modulated RF signal.

Moreover, in accordance with a preferred embodiment of the present invention, the step of correcting includes the step of determining calibration parameters from output the step of convolving during the calibration procedure.

Further, in accordance with a preferred embodiment of the present invention, the step of correcting includes the step of utilizing the calibration parameters to correct at least one of the resultant signals during regular operation and to produce thereby the corrected signals.

Finally, in accordance with a preferred embodiment of the present invention, the step of creating a periodic signal includes the steps of creating a first periodic signal having a single octave frequency range and dividing the frequency of the first periodic signal by a multiple of two.

BRIEF DESCRIPTION OF THE DRAWINGS

The present invention will be understood and appreciated more fully from the following detailed description taken in conjunction with the drawings in which.

DETAILED DESCRIPTION OF A PREFERRED EMBODIMENT

Figure 1:
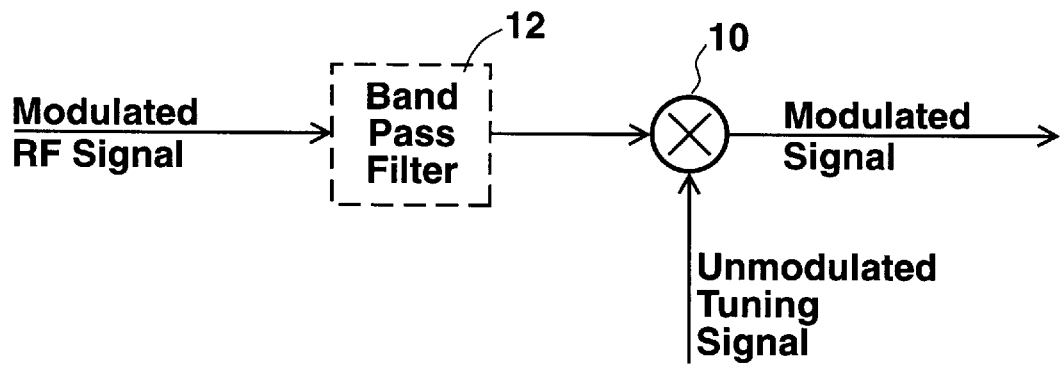
FIG. 1 is a schematic illustration of parts of a prior art radio frequency tuner.
Figure 2:
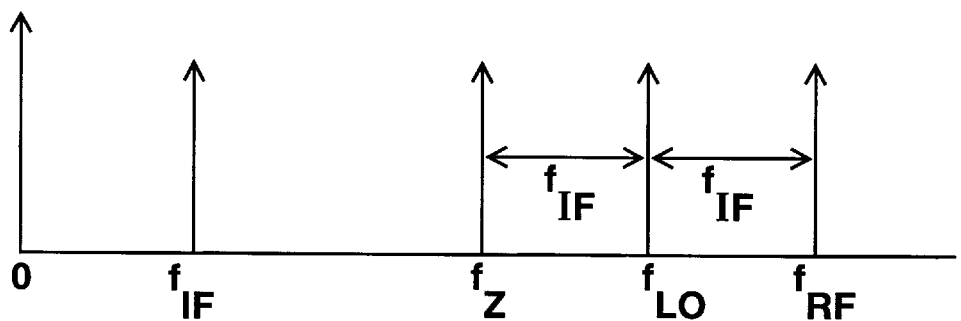
FIG. 2 is a graphical illustration of a frequency map of the signals of the radio frequency tuner of FIG. 1.
Figure 3:
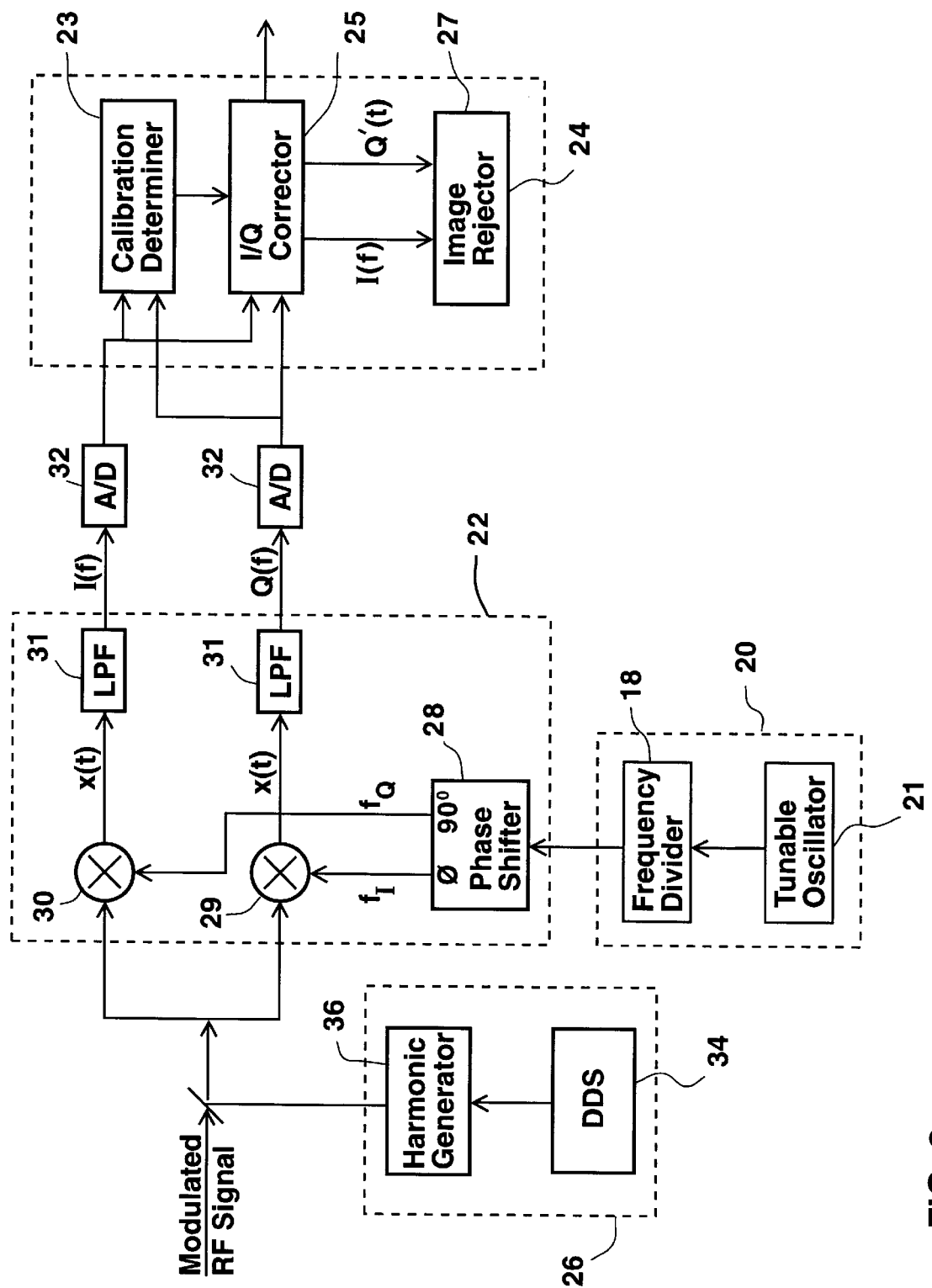
FIG. 3 is a block diagram illustration of a radio frequency tuner constructed and operative in accordance with a preferred embodiment of the present invention.

Reference is now made to FIG. 3 which illustrates a radio frequency tuner which can digitally process the difference signal, constructed and operative in accordance with the principles of the present invention. The radio frequency tuner of FIG. 3 comprises a tuning unit 20, an I/Q mixer 22, a calibrated image rejection processor 24 and a calibration unit 26.

The tuning unit 20 typically comprises a tunable oscillator or synthesizer 21 and, optionally, a frequency divider 18. The tuning unit 20 provides a periodic signal at a selectable tuning frequency $f_{1o}$ close to the expected carrier frequency $f_{RF}$ of a modulated, incoming radio frequency (RF) signal. The incoming RF signal has a frequency typically varying between 20–1200 Mhz and, in accordance with the present invention, the tuning frequency $f_{1o}$ is set to generally 25 Khz lower than the incoming RF signal.

The I/Q mixer 22 can be similar to any I/Q mixer, for example, the IQF-9L series commercially available from Merrimac Inc. of West Caldwell, N.J., USA. The I/Q mixer 22 comprises a phase shifter 28, two convolvers 29 and 30 and two low pass filters (LPFs) 31. Phase shifter 28 receives the periodic signal from the oscillator 20 and produces two signals, an inphase signal, labeled $f_I$, and a quadrature signal, labeled $f_Q$, which is 90° phase-shifted from the periodic signal $f_I$. The convolvers 29 and 30, respectively, convolve the incoming signal with the inphase and quadrature signals. The resultant difference signals are intermediate frequency signals and are labeled x(t) and y(t) respectively.

It is noted that the difference signals x(t) and y(t) include both low frequency components and higher frequency components. The low pass filters 31 filter the difference signals x(t) and y(t) to remove the high frequency components. The resultant signals are low frequency signals difference I(t) and Q(t) whose conversion to digital representations will not require unreasonably large numbers of sample points. The conversion is accomplished with analog-to-digital (A/D) converters 32.

However, if the inphase and quadrature signals are not completely matched (i.e. the quadrature signal is not exactly 90° out of phase with the inphase signal and/or its amplitude is slightly different), the low frequency difference signals will contain in them low frequency image components, as described in more detail hereinbelow. Therefore, the difference signals I(t) and Q(t) must be processed to remove the low frequency image signal, which processing is performed by the calibrated image rejection processor 24.

Since the accuracy of the image rejection is a function of the accuracy of the phase shifter 28 and since the inaccuracy is measurable, the present invention includes calibration unit 26 to provide a signal from which the parameters of the inaccuracy can be determined. The parameters are the differences in amplitude and phase between the two quadrature and inphase output signals of the phase shifter 28.

Processor 24 comprises a calibration determiner 23, an I/Q corrector 25 and an image rejector 27, wherein the image rejector 27 performs image rejection processing, a known technique to remove image signals. For example, the image rejection mixers of Watkins Johnson, such as the WJ-M38D, performs the technique.

The calibration determiner 23 determines the parameters of the inaccuracy and the I/Q corrector corrects the Q(t) signal in response. The resultant signals are then processed by the image rejector 27. Both the parameter determination and the correction generation methods are described in detail hereinbelow.

The calibration unit 26 comprises a direct digital synthesizer (DDS) 34 and an harmonic generator 36 and is operative to provide a signal at the image frequency $f_2$. The DDS 34 generates a signal at a variable low frequency, such as 10 Mhz, and the harmonic generator 36 converts the output of the DDS 34 to the desired frequency. The output of the harmonic generator 36, rather than the modulated RF signal, is then provided to the I/Q mixer 22. A switch symbol, marked by the reference numeral 40, indicates that one or the other of the modulated RF frequency signal and the output of the harmonic generator 36 forms the input to the I/Q mixer 22.

Figure 4:
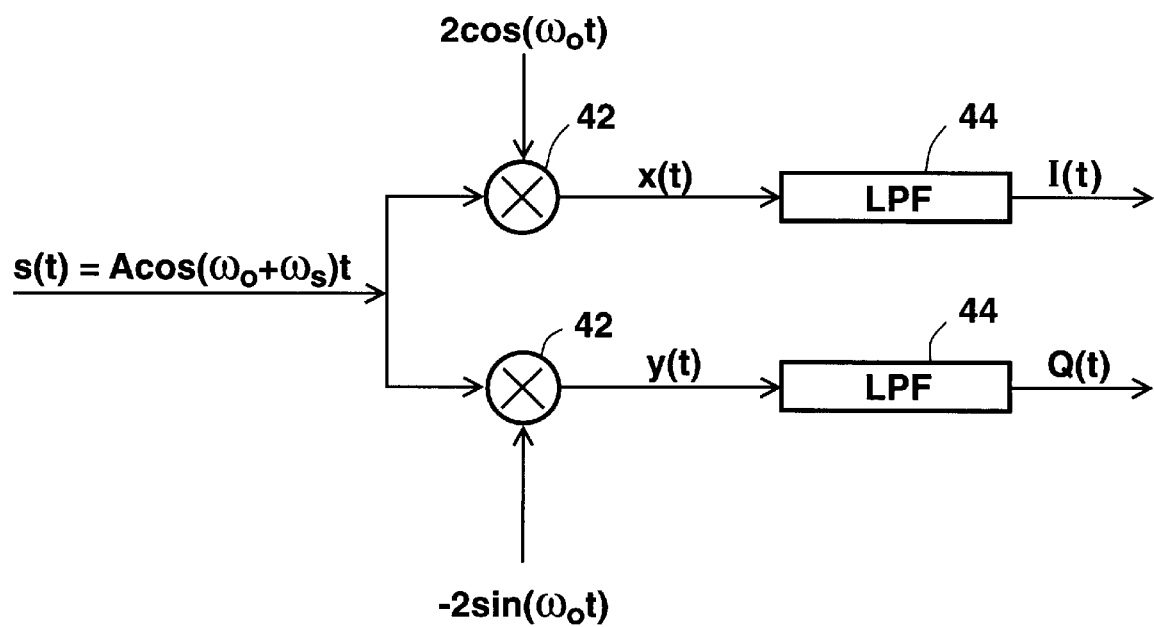
FIG. 4 illustrates an ideal I/Q mixer.

The calibration operations are described hereinbelow with reference to FIG. 4. FIG. 4 illustrates an ideal I/Q mixer which operates on an incoming RF signal S(t). It comprises two convolvers 42 and two low pass filters (LPFs) 44. The convolvers 42 receive the inphase signal, which is described by 2cos(Wot), and the quadrature signal, which is described by −2 sin(Wot). The frequency of the incoming signal S(t) is defined as the sum of a low frequency component Ws and a high frequency component Wo, wherein Wo matches the frequency of the inphase and quadrature signals. Thus, $$S(t)=A\ \cos(Ws+Wo)t \qquad (1)$$

The convolved difference signals x(t) and y(t) are given by:

$$x(t)=2A\ \cos\ [(Wo+Ws)t]^* \cos(Wot)=A\{\cos(Wst)+\cos[(2Wo+Ws)t]\} \qquad (2)$$

$$y(t)=-2A\ \cos\ [(Wo+Ws)t]^* \sin(Wot)=A\{\sin(Wst)-\sin[(2Wo+Ws)t]\} \qquad (3)$$

The filtered difference signals I(t) and Q(t) are given by:

$$I(t)=A\ \cos(Wst) \qquad (4)$$

$$Q(t)=A\ \sin(Wst) \qquad (5)$$

If the inphase and quadrature signals are mismatched, errors will occur. For the purposes of this discussion, the mismatching will be assumed to occur in the quadrature signal only. The amplitude of the quadrature signal may differ from that of the inphase signal by an amount $\epsilon$ and the phase may be $\alpha°$ away from 90° different than the inphase signal. Thus, the mismatched quadrature signal can be written as: $-2(1+\epsilon) \sin(Wot-\alpha)$. From the above discussion, the filtered difference signals I(t) and Q(t) become:

$$I(t)=A\ \cos(Wst) \qquad (6)$$

$$Q(t)=A(1+\epsilon)\ \sin(Wst+\alpha) \qquad (7)$$

The inphase and quadrature signals can be expressed as a complex function Z(t) as follows:

$$Z(t)=I(t)+Q(t)=A/2[1+(1+\epsilon)e^{j\alpha}]e^{jWst}+A/2[1-(1+\epsilon)e^{-j\alpha}]e^{-jWst} \qquad (8)$$

The left term of equation 8 is the desired low frequency signal with some amplitude and phase variation with respect to the ideal case. The right term of equation 8 is an image signal having a negative frequency. If the mismatch is small, i.e. $\epsilon$ and $\alpha$ much smaller than 1, then the real and ghost signals, Zs(t) and Zg(t), respectively, will be given by:

$$Zs(t)=A(1+\epsilon/2+j\alpha/2)e^{jWst} \qquad (9)$$

$$Zg(t)=A(\epsilon/2+j\alpha/2)e^{-jWst} \qquad (10)$$

The ghost signal Zg(t) is removed during the image rejection operation.

During calibration, the calibration determiner 25 generates the following signals: the autocorrelation Rii(0) of the I(t) signal, the autocorrelation Rqq(0) of the Q(t) signal and the crosscorrelation Riq(0) between the I(t) and Q(t) signals. Using equations 6 and 7 we determine the following:

$$Rii(0)=A^2 \quad (11)$$

$$Rqq(0)=A^2(1+\epsilon)^2 \quad (12)$$

$$Riq(0)=A^2(1+\epsilon)\sin\alpha \quad (13)$$

From equations 11–13 we derive:

$$\epsilon = \sqrt{Rqq(0)/Rii(0)} - 1 \quad (14)$$

$$\sin(\alpha) = (1+\epsilon)Riq(0)/Rqq = Riq(0)/\sqrt{Rii(0)Rqq(0)} \quad (15)$$

During operation, the I/Q corrector 25 corrects only the quadrature signal Q(t). Q(t) can be expressed as:

$$Q(t)=A(1+\epsilon)[\sin(Wst)\cos(\alpha)+\cos(Wst)\sin(\alpha)] \quad (16)$$

Since the desired corrected signal is Q'(t)=A sin(Wst), the uncorrected quadrature signal Q(t) can be written as a function thereof, as follows:

$$Q(t)=(1+\epsilon)[Q'(t)\cos(\alpha)+I(t)\sin(\alpha)] \quad (17)$$

The corrected signal Q'(t) is thus:

$$Q'(t)=[Q(t)/(1+\epsilon)-I(t)\sin(\alpha)]/\cos(\alpha)=Q(t)/(1+\epsilon)\cos(\alpha)-I(t)\sin(\alpha) \quad (18)$$

The I/Q corrector 25 generates the corrected signal Q'(t) for each sample point of the Q(t) signal and provides it to the image rejector 27 for processing. The image rejector 27 then removes the image from the signal formed of I(t) and Q'(t) in accordance with known techniques.

It is noted that the tunable oscillator 21 typically provides signals within one octave range of frequencies, such as from 620–1100 MHz. In order to process an RF signal with a much wider range of frequencies, as is common, the tuning unit 20 can additionally include the frequency divider 18 which can divide the frequency of the output of the tunable oscillator 21 by a multiple of 2, such as by 1 (i.e. no change in frequency), 2, 4, 8 and 16. The frequency divider 18, in effect, changes the octave of the tuning frequency $f_{1o}$, and, as a result, enables the receiver of the present invention to receive multi-octave RF signals.

It will be appreciated by persons skilled in the art that the present invention is not limited to what has been particularly shown and described hereinabove. Rather the scope of the present invention is defined by the claims which follow.

I claim:

1. A near homodyne radio frequency (RF) receiver for receiving a modulated RF signal having a center frequency and able to be calibrated utilizing a calibration signal, said receiver comprising:

an RF switch having a first and second inputs and an output, said first input coupled to said modulated RF signal, said second input coupled to said calibration signal, said IRF switch able to switch between said first input and said second input being coupled to said output, said RF switch coupling said calibration signal to said output during a calibration period;

a tuning unit for generating a local oscillator signal relatively close to but not exactly equal to said center frequency of said modulated RF signal;

an inphase/guadrature (I/Q) mixer having an I input, I output, a Q input and Q output, said I/Q mixer mixing said output of said RF switch shifted by 90 degrees with said local oscillator signal and low pass filtering the resultant signal to generate said I output signal, said I/Q mixer mixing said output of said RF switch with said local oscillator signal and low pass filtering the resultant signal to generate said Q output signal;

wherein said modulated RF signal is mixed by said local oscillator signal such that the center frequency of said I output and said Q output signals are relatively close to but not equal to zero Hertz;

a direct digital synthesizer for generating a periodic signal;

a harmonic generator coupled to said direct digital synthesizer for processing the output of said direct digital synthesizer and generating said calibration signal;

an image rejection processor coupled to said I output and said Q output, said image rejection processor correcting said I output and said Q output signals and performing image rejection on said I output and Q output signals.

2. A near homodyne radio frequency (RF) receiver for receiving a modulated RF signal having a center frequency and able to be calibrated utilizing a calibration signal, said receiver comprising:

an RF switch having a first and second inputs and an output, said first input coupled to said modulated RF signal, said second input coupled to said calibration signal, said RF switch able to switch between said first input and said second input being coupled to said output, said RF switch coupling said calibration signal to said output during a calibration period;

a tuning unit for generating a local oscillator signal relatively close to but not exactly equal to said center frequency of said modulated RF signal;

an inphase/guadrature (I/Q) mixer having an I input, I output, a Q input and Q output, said I/Q mixer mixing said output of said RF switch shifted by 90 degrees with said local oscillator signal and low pass filtering the resultant signal to generate said I output signal, said I/Q mixer mixing said output of said RF switch with said local oscillator signal and low pass filtering the resultant signal to generate said Q output signal;

wherein said modulated RF signal is mixed by said local oscillator signal such that the center frequency of said I output and said Q output signals are relatively close to but not equal to zero Hertz;

a calibration unit coupled to said second input of said RF switch, said calibration unit generating said calibration signal;

a calibration determiner coupled to said I output and said Q output signals, said calibration determiner determining calibration parameters from said I output and said Q output signals during said calibration period;

an I/Q corrector coupled to said calibration determiner, said I/Q corrector utilizing said calibration parameters to correct said I output and said Q output signals and generate corrected signals therefrom; and an image rejecter coupled to said I/Q corrector, said image rejecter performing image rejection on said corrected signals.

* * * * *